(12) United States Patent
Senda et al.

(10) Patent No.: US 7,087,930 B2
(45) Date of Patent: Aug. 8, 2006

(54) SEMICONDUCTOR LIGHT EMITTING ELEMENT AND METHOD OF MAKING SAME

(75) Inventors: Masanobu Senda, Aichi-ken (JP); Jun Ito, Aichi-ken (JP); Kazuki Nishijima, Aichi-ken (JP); Toshimasa Hayashi, Aichi-ken (JP)

(73) Assignee: Toyodaa Gosei Co., Ltd., Aichi-ken (JP)

( * ) Notice: Subject to any disclaimer, the term of this patent is extended or adjusted under 35 U.S.C. 154(b) by 78 days.

(21) Appl. No.: 10/808,422

(22) Filed: Mar. 25, 2004

(65) Prior Publication Data
US 2004/0232428 A1 Nov. 25, 2004

(30) Foreign Application Priority Data
Mar. 28, 2003 (JP) .............................. 2003-090884

(51) Int. Cl.
 *H01L 27/15* (2006.01)
(52) U.S. Cl. .......................... 257/79; 257/13; 257/190
(58) Field of Classification Search ................ 257/79, 257/13, 190
See application file for complete search history.

(56) References Cited

U.S. PATENT DOCUMENTS

| 6,312,967 | B1* | 11/2001 | Ikeda ............................ 438/22 |
| 6,348,096 | B1* | 2/2002 | Sunakawa et al. ............. 117/88 |
| 6,368,733 | B1* | 4/2002 | Nishinaga ..................... 428/698 |
| 6,468,882 | B1* | 10/2002 | Motoki et al. ................ 438/460 |
| 6,469,320 | B1* | 10/2002 | Tanabe et al. ................. 257/79 |
| 6,716,724 | B1* | 4/2004 | Iyechika et al. .............. 438/481 |
| 6,809,351 | B1* | 10/2004 | Kuramoto et al. ........... 257/190 |

FOREIGN PATENT DOCUMENTS

| JP | 11-130597 | 5/1999 |
| JP | 2000-021789 | 1/2000 |
| JP | 2000-357663 | 12/2000 |
| JP | 2001-160657 | 6/2001 |
| JP | 2002-164296 | 6/2002 |
| JP | 2002-280609 | 9/2002 |

OTHER PUBLICATIONS

Yoshiaki Honda, et al., "Transmission Electron Microscopy Investigation of Dislocations in GaNLayer Grown by Facet-Controlled Epitaxial Lateral Overgrowth", Japanese Journal of Applied Physics, vol. 40, Apr. 1, 2001, pp. L309-L312.
Hiromitsu Mizutani, et al., "Reduction of dislocation density in GaN using FACELO (Facet Controlled Epitaxial Lateral Overgrowth)", Technical Report of IEICE, ED2000-22, CPM2000-7, SDM2000-22 (May 2000), pp. 35-40.

(Continued)

*Primary Examiner*—Bradley K. Smith
*Assistant Examiner*—Douglas M. Menz
(74) *Attorney, Agent, or Firm*—McGinn IP Law Group, PLLC

(57) ABSTRACT

A semiconductor light emitting element that is made by using the lateral growth function of semiconductor crystal while providing an ELO mask on a crystal growth surface of a crystal growth substrate. At least part of a sidewall of the ELO mask is provided with an inclined plane that is inclined to the crystal growth surface such that the semiconductor crystal to be formed on the ELO mask substantially has no void.

20 Claims, 12 Drawing Sheets

OTHER PUBLICATIONS

Kazuyuki Tadatomo, et al., "High Output Power InGaN Ultraviolet Light-Emitting Diodes Fabricated on Patterned Substrates Using Metalorganic Vapor Phase Epitaxy", Japanese Journal of Applied Physics, vol. 40, Jun. 15, 2001, pp. L583-L585.

Motokazu Yamada, et al., "InGaN-Based Near-Ultraviolet and Blue-Light-Emitting Diodes with High External Quantum Efficiency Using a Patterned Sapphire Substrate and a Mesh Electrode", Japanese Journal of Phsysics, vol. 41, Dec. 15, 2002, pp. L1431-L1433.

* cited by examiner

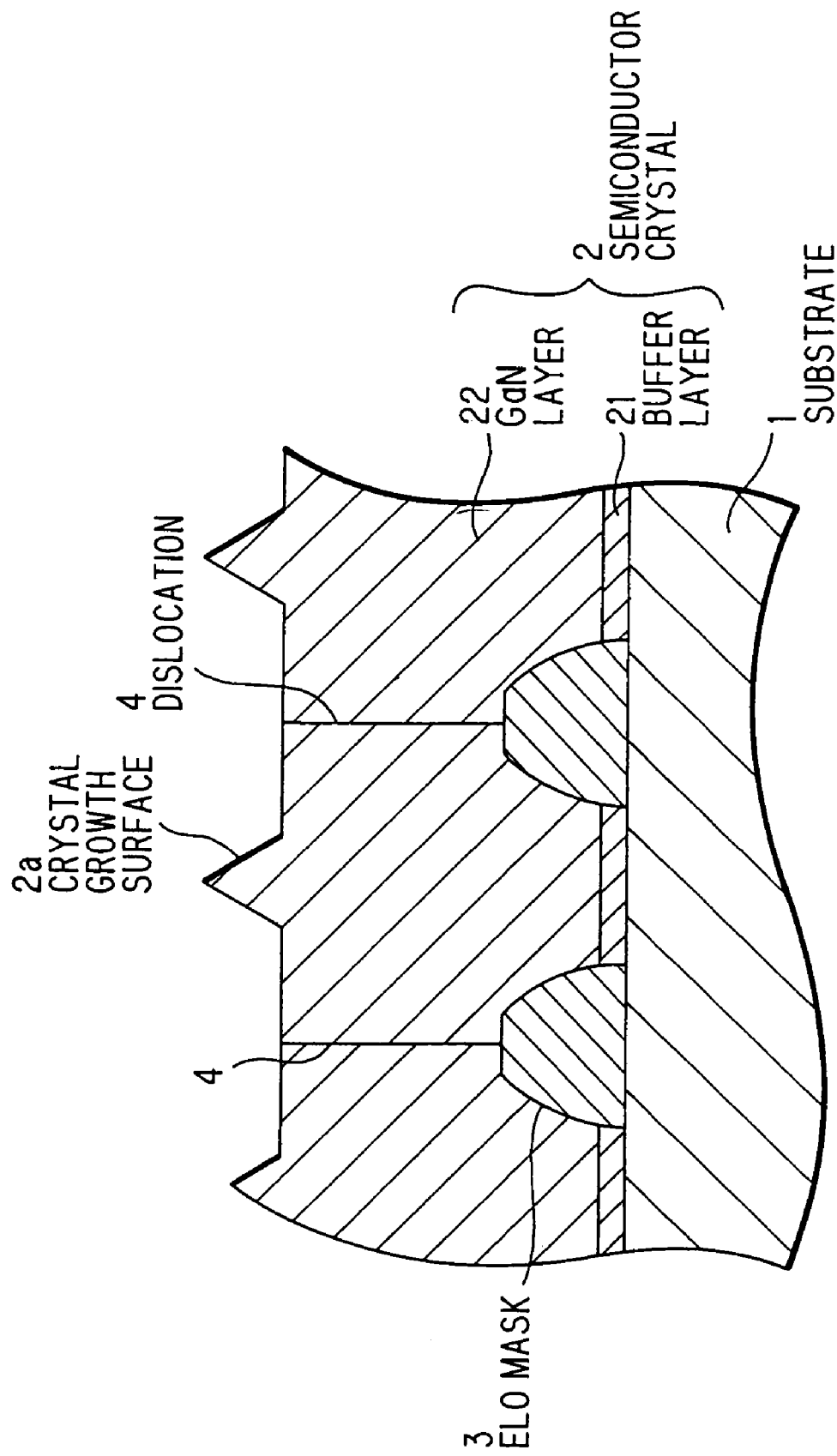

SEMICONDUCTOR LIGHT EMITTING ELEMENT AND METHOD OF MAKING SAME

The present application is based on Japanese patent application No. 2003-090884, the entire contents of which are incorporated herein by reference.

BACKGROUND OF THE INVENTION

1. Field of the Invention

The invention relates to a method of making a semiconductor crystal by using an ELO (epitaxial lateral overgrowth) mask of amorphous material formed on a crystal growth surface to offer lateral growth of crystal. Also, the invention relates to a semiconductor light emitting element made by using the method.

2. Description of the Related Art

Several methods of reducing a dislocation or void in the crystal to make a good semiconductor crystal by using an ELO mask are known (e.g., prior arts 1 to 4 below).

Japanese patent application laid-open No. 2000-21789 (prior art 1) discloses that the number of voids or cracks can be relatively reduced by using an ELO mask formed on an underlying layer of AlGaN.

Japanese patent application laid-open No. 2000-357663 (prior art 2) discloses an ELO crystal growth method that is based on formation of semiconductor film (=first semiconductor film) with steps.

"Transmission Electron Microscopy Investigation of Dislocations in GaN Layer Grown by Facet-Controlled Epitaxial Lateral Overgrowth", JAPANESE JOURNAL OF APPLIED PHYSICS, Vol. 40 (2001), pp. L309–L312, Part 2, No. 4A, 1 Apr. 2001 (prior art 3) discloses a crystal growth method for reducing the number of dislocations. Prior art 3 also describes about the crystal growth process that voids or dislocations are formed.

Hiromitsu Mizutani et al., "Reduction of dislocation density in GaN using FACELO (Facet Controlled Epitaxial Lateral Overgrowth)", TECHNICAL REPORT OF IEICE, ED2000-22, CPM2000-7, SDM2000-22(2000–05)(prior art 4) discloses a crystal growth method that formation of void can be controlled by adjusting a ratio of a width of region to be covered with ELO mask (mask width) and a width of region not to be covered with ELO mask (window width) on the surface of a crystal growth substrate or by adjusting the conditions of crystal growth (temperature, flow rate of source gas etc.). However, prior art 4 is based on intentional formation of voids that the number of dislocations is reduced by terminating the growth of dislocation at a void site.

Problems caused by the formation of void will be described below.

FIG. 1 is a schematic cross sectional view showing an ELO mask 3 and its vicinity to illustrate the formation of void in prior art method. The ELO mask 3 of amorphous material is formed on a crystal growth surface 1a of crystal growth substrate 1. When a semiconductor crystal 2 of e.g., GaN is grown on the crystal growth surface 1a with the ELO mask 3, voids 4 or dislocations are generated.

Prior art 3 describes an example of formation of voids of about 3 to 8 μm. In such a region with voids formed, it is impossible to form a continuous and monolithic semiconductor layer (e.g., n-type contact layer). So, in order to form a semiconductor device structure (e.g., semiconductor layer after n-contact layer) to be further formed thereon, the crystal growth has to be continued until when having a continuous flat plane of crystal growth surface while covering the voids. Thus, when a semiconductor device structure is formed on a semiconductor crystal with voids, a thick layer of semiconductor crystal must be grown such that it reaches above the height of voids. Therefore, the productivity must lower.

Further, when a thick layer of semiconductor crystal is thus formed, a deformation such as warp occurs around the interface due to a difference in thermal expansion coefficient between a crystal growth substrate and a semiconductor crystal layer formed thereon. There may occur a problem in subsequent alignment step.

Further, in aspect of external quantum efficiency, it is undesirable to have such a void since part of light emitted from a light emitting element formed on the semiconductor crystal 2 may be diffused by such a void.

As described, prior arts 1 and 2 relate to some crystal growth method to reduce the occurrence of void to make a good semiconductor crystal.

On the other hand, crystal growth methods, called stepwise ELO, to reduce the number of dislocations in semiconductor crystal without using any ELO mask are known (Japanese patent application laid-open Nos. 2002-164296 (prior art 5) and 2002-280609 (prior art 6), "High Output Power InGaN Ultraviolet Light-Emitting Diodes Fabricated on Patterned Substrates Using Metalorganic Vapor Phase Epitaxy", JAPANESE JOURNAL OF APPLIED PHYSICS, Vol. 40(2001), pp. L583–L585, Part 2, No. 6B, 15 Jun. 2001 (prior art 7), and "InGaN-Based Near-Ultraviolet and Blue-Light-Emitting Diodes with High External Quantum Efficiency Using a Patterned Sapphire Substrate and a Mesh Electrode", JAPANESE JOURNAL OF APPLIED PHYSICS, Vol. 41(2002), pp. L1431–L1433, Part 2, No. 12B, 15 Dec. 2002) (prior art 8).

The above crystal growth methods are conducted such that an effective uneven pattern to cause a lateral growth of semiconductor crystal is provided on the crystal growth surface of a crystal growth substrate. Thus, the lateral growth of semiconductor crystal is used to have a good semiconductor crystal.

However, in prior arts 1 and 2, there are some requirements in the process that the AlGaN layer is to be formed as an underlying layer and that the semiconductor film with steps is to be formed. These requirements may further complicate the semiconductor crystal growth process for light emitting element that is complicated recently. Namely, in case of using these methods, it is difficult to obtain a good semiconductor crystal while simplifying the crystal growth process.

In the crystal growth method called stepwise ELO as disclosed in prior arts 5 to 8, it is impossible to arbitrarily select or adjust the refractive index of convex portion independently of that of a material of crystal growth substrate since the convex portion on crystal growth surface is made of the same material as the crystal growth substrate. Namely, in the above stepwise ELO, it is theoretically impossible to select or adjust, as in case of using an ELO mask, the material of convex portion on crystal growth surface to enhance the external quantum efficiency.

SUMMARY OF THE INVENTION

It is an object of the invention to provide a method of making a semiconductor light emitting element that the crystal growth process can be simplified and shortened while offering a good semiconductor crystal with no void.

It is a further object of the invention to provide a semiconductor light emitting element that has an improved external quantum efficiency or internal quantum efficiency.

According to one aspect of the invention, a semiconductor light emitting element is provided that is made by using the lateral growth function of semiconductor crystal while providing an ELO mask on a crystal growth surface of a crystal growth substrate, wherein at least part of a sidewall of the ELO mask is provided with an inclined plane that is inclined to the crystal growth surface such that the semiconductor crystal to be formed on the ELO mask substantially has no void.

According to another aspect of the invention, a method of making a semiconductor light emitting element comprises the steps of:

forming an ELO mask on a crystal growth surface of a crystal growth substrate;

providing at least part of a sidewall of the ELO mask with an inclined plane that is inclined to the crystal growth surface; and growing semiconductor crystal on the crystal growth surface of the crystal growth substrate.

BRIEF DESCRIPTION OF THE DRAWINGS

The preferred embodiments according to the invention will be explained below referring to the drawings, wherein:

FIGS. 6A to 6D are schematic cross sectional views showing a process of making a semiconductor crystal 2 in a preferred embodiment of the invention.

DETAILED DESCRIPTION OF THE PREFERRED EMBODIMENTS

Figure 1:
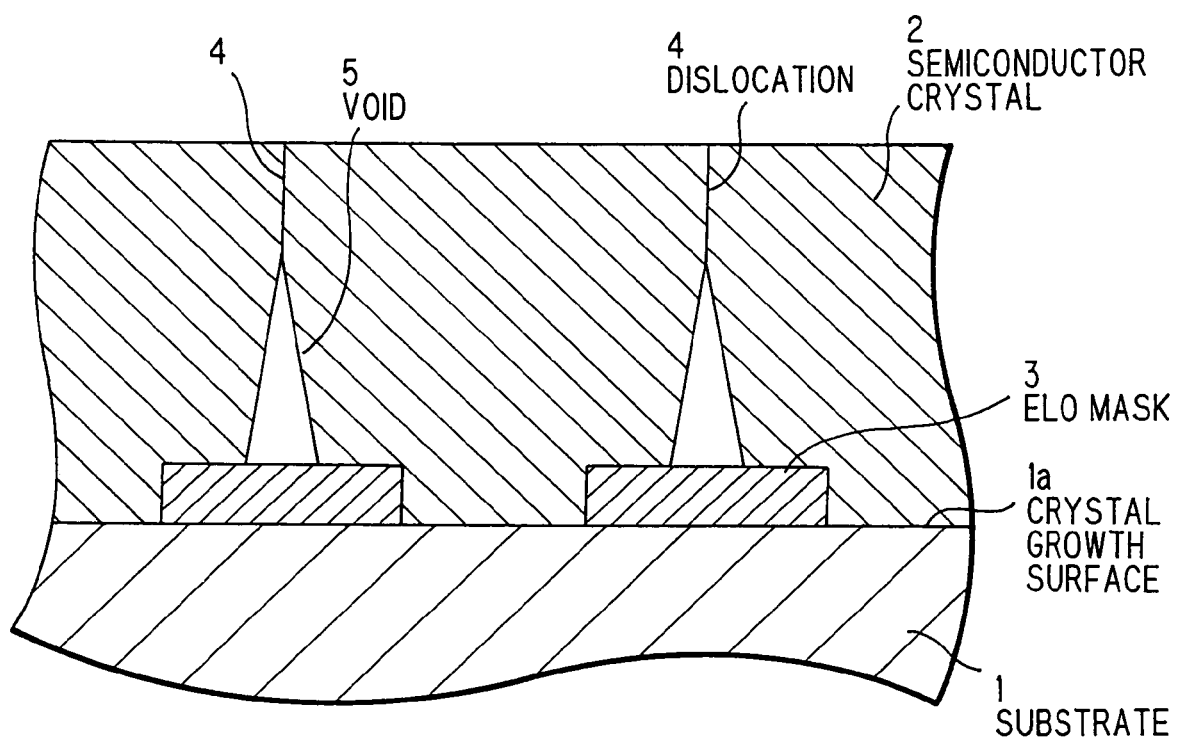
FIG. 1 is a schematic cross sectional view showing an ELO mask 3 and its vicinity to illustrate the formation of void in the conventional method.

In order to enhance the emission efficiency of semiconductor light emitting element, it is important to optimize a profile of ELO mask with an uneven pattern or a refractive index thereof other than reducing the number of dislocations in semiconductor crystal.

The objects of the invention can be attained by the following means (=embodiments).

[1] The first means of the invention is a semiconductor light emitting element that is made by using the lateral growth function of semiconductor crystal while providing an ELO mask on a crystal growth surface of a crystal growth substrate, wherein at least part of a sidewall of the ELO mask is provided with an inclined plane that is inclined to the crystal growth surface such that the semiconductor crystal to be formed on the ELO mask substantially has no void.

The above semiconductor crystal can be of III-nitride system compound semiconductors. The III-group nitride system compound semiconductors include a two to four elements III-nitride system compound semiconductor represented by a general formula: $Al_{1-x-y}Ga_yIn_xN$; $0 \leq x \leq 1$, $0 \leq y \leq 1$, $0 \leq 1-x-y \leq 1$ and may be doped with p-type or n-type impurity.

In the above III-group nitride system compound semiconductors, at least part of the III-group element (Al, Ga, In) may be replaced by boron (B), thallium (Tl) etc. or at least part of nitrogen (N) may be replaced by phosphorus (P), arsenic (As), antimony (Sb), bismuth (Bi) etc.

The p-type impurity includes magnesium (Mg), calcium (Ca) etc. The n-type impurity includes silicon (Si), sulfur (S), selenium (Se), tellurium (Te), germanium (Ge) etc. Two or more elements of the impurities maybe simultaneously added, and both types (p-type and n-type) of the impurities may be simultaneously added.

The ELO mask is a film or layer for crystal growth restriction to be formed on the crystal growth surface that allows the crystal growth of abovementioned semiconductor. It is provided expecting that the semiconductor crystal begins growing at a region (window section) in the crystal growth surface with no ELO mask formed and is then formed up to on the film or layer by its lateral growth function. The ELO mask may be preferably of amorphous material, but may be of a known or arbitrary material. For example, it may be of $SiO_2$, $ZrO_2$, W, $HfO_2$, $Y_2O_3$ etc.

The ELO mask is not necessarily needed to be directly formed on the crystal growth surface of crystal growth substrate. For example, the ELO mask may be formed on a known semiconductor layer such as a buffer layer previously formed on the crystal growth surface. Such a semiconductor layer previously formed on the crystal growth surface may have a multilayer structure.

However, in view of light extraction efficiency, it is desirable that the emission efficiency is to be optimized considering the magnitude relation of refractive index or the stack order in the composition of crystal growth substrate, underlying semiconductor crystal such as buffer layer, ELO mask, and semiconductor crystal layer to be grown on the ELO mask.

Figure 2A:
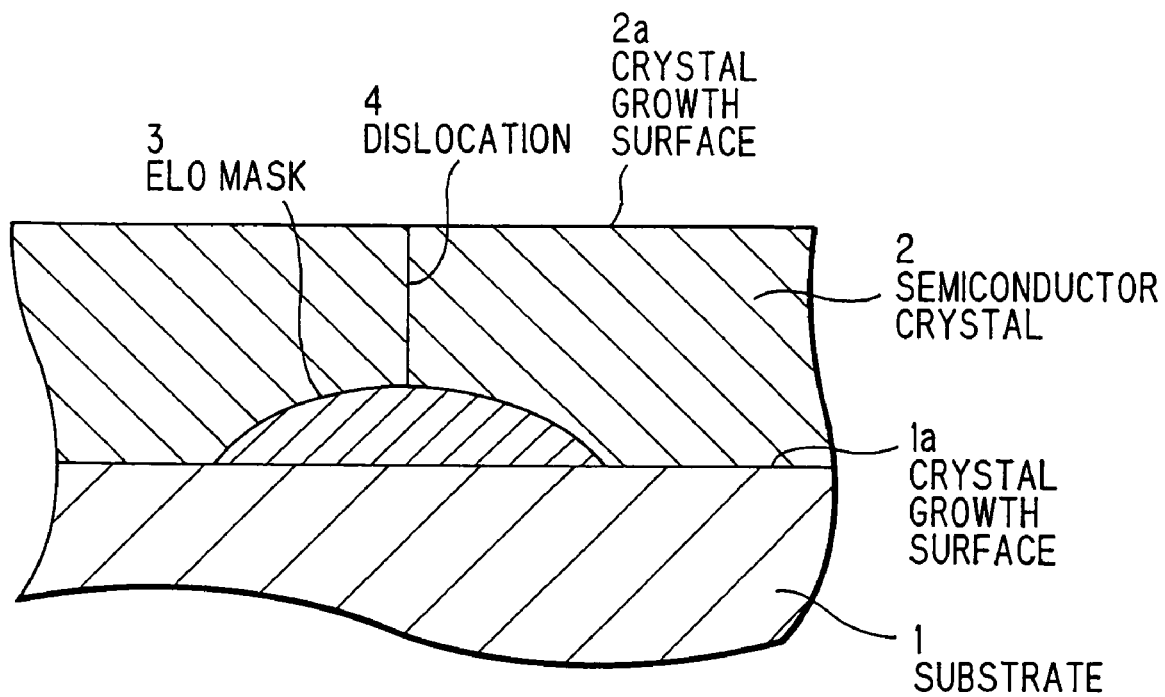
FIGS. 2A and 2B are schematic cross sectional views showing an ELO mask 3 and its vicinity in a preferred embodiment of the invention.
Figure 2B:
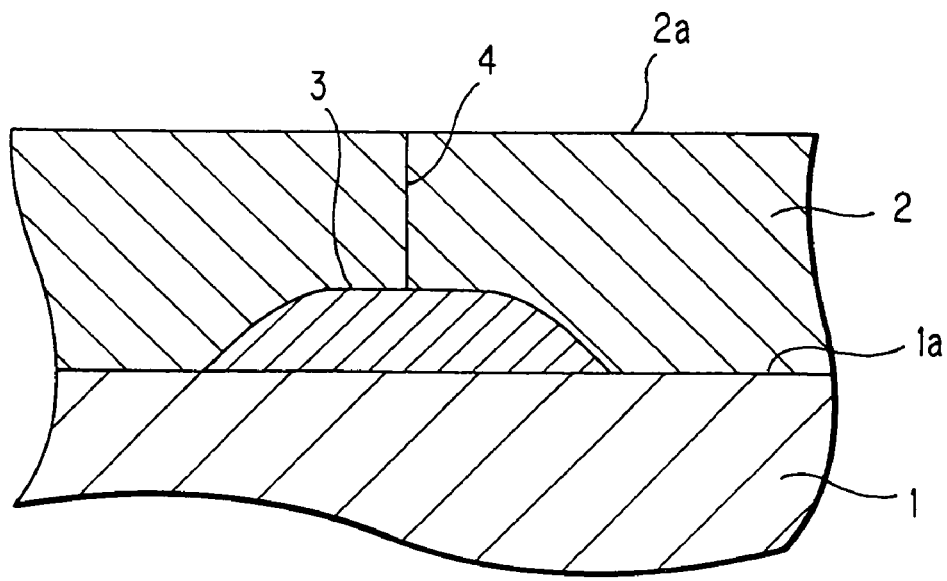
Figure 3:
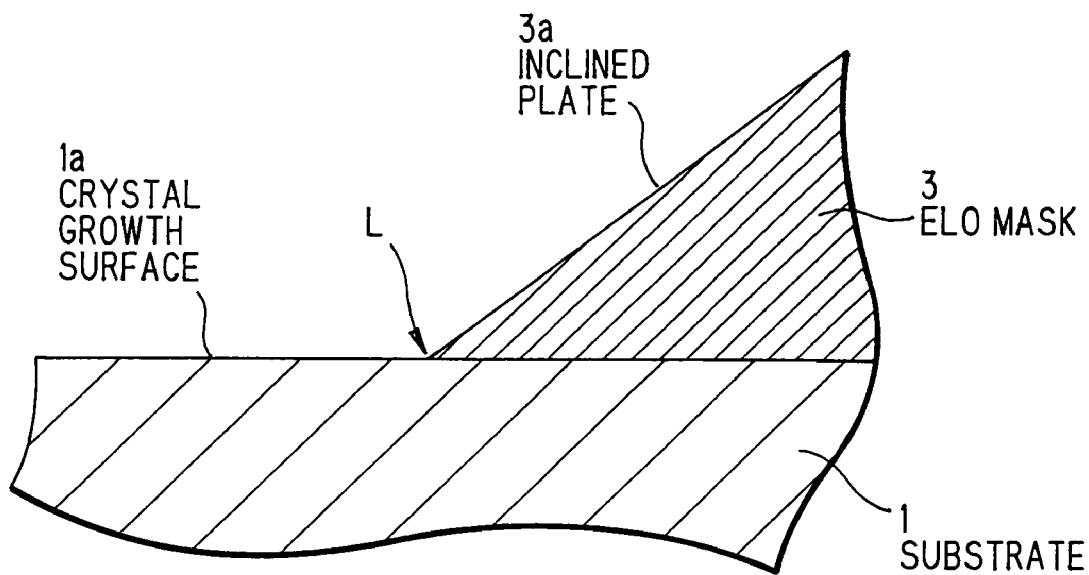
FIG. 3 is schematic enlarged cross sectional views showing crystal growth near at a boundary L between crystal growth surface 1a and the ELO mask 3.
Figure 3:
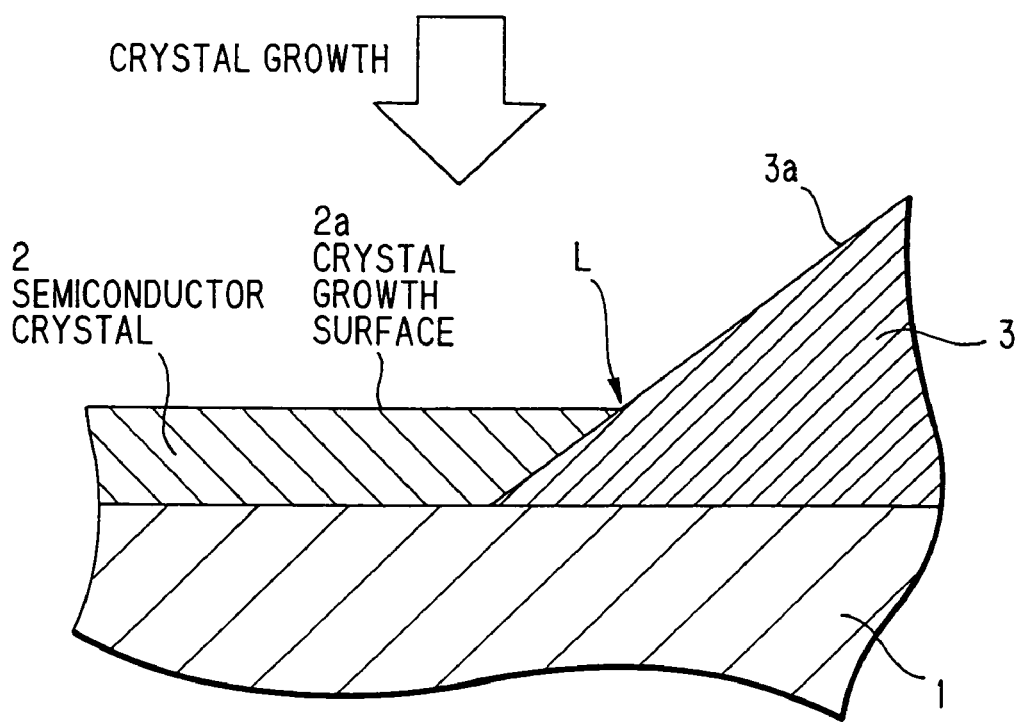

FIGS. 2A, 2B and FIG. 3 are schematic cross sectional views showing an ELO mask 3 and its vicinity in the preferred embodiment of the invention.

As shown in FIGS. 2A and 2B, the ELO mask 3 with a dome shape in cross section is formed on a crystal growth surface 1a of crystal growth substrate 1. Semiconductor crystal 2 is grown on the crystal growth substrate 1 masked by the ELO mask 3. A dislocation 4 is grown from the top center of ELO mask 3 to a crystal growth surface 2a of semiconductor crystal 2.

Thus, by providing an inclined plane on the sidewall of ELO mask 3, a void becomes unlikely to generate above the ELO mask 3. Although in this case the dislocation 4 is formed at the junction of semiconductor crystals 2 to be grown on the ELO mask 3, the formation of void can be perfectly prevented near a start point where the dislocation 4 starts growing.

The reason why the formation of void can be prevented is that semiconductor crystal 2 can be laterally grown close to and along the inclined plane of ELO mask 3 even during the crystal growth surface 2a of semiconductor crystal 2 moves upward from the crystal growth surface 1a of crystal growth substrate 1.

In FIG. 3, sign L indicates a boundary between the inclined plane 3a of ELO mask 3 and the crystal growth surface 1a or 2a, on the exposed surface. The source gases for semiconductor crystal 2 are more likely to be supplied near the boundary L. The reasons are as follows:

(1) The sidewall of ELO mask 3 is inclined spreading upward. Namely, the inclined plane 3a is exposed upward. Therefore, at an arbitrary point on the boundary L, a three-dimensional angle to space where source gases can exist is large. Thereby, the source gases can approach the boundary L from the large range of three-dimensional angle.

(2) The source gases for crystal growth are not consumed (sublimated) on the inclined plane 3a since the ELO mask 3 is amorphous. Further, since the boundary L is located on the inclined plane 3a, the remaining part of source gases being not consumed on the inclined plane 3a is likely to be supplied near the boundary L.

Further, since the inclined plane 3a has a proper inclination angle, the semiconductor crystal 2 can be, near the inclined plane 3a, laterally grown along the inclined plane 3a, in the same way as being grown vertically. Also, since the semiconductor crystal 2 is not needed to grow horizontally near the boundary L, it can be efficiently grown along the inclined plane 3a near the boundary L.

Although in FIG. 3 the inclined plane 3a is expressed flat, it may be formed curved. Also in this case, the same effect can be obtained.

Based on the functions abovementioned, the semiconductor crystal 2 can be laterally grown along the inclined plane 3a of ELO mask 3. Therefore, the case of prior art in FIG. 1 can be avoided that the speed of lateral growth becomes significantly lower than that of vertical growth on the exposed surface of ELO mask 3 or its vicinity. Thus, the semiconductor crystal 2 can be formed without void even on the ELO mask 3.

In the invention, the occurrence of void on the ELO mask 3 can effectively prevented. In case of semiconductor light emitting element, diffusion of light due to the existence of void near the crystal growth surface 1a may cause a problem in device function. Such a problem can be solved or suppressed by preventing the occurrence of void as described above.

Further, the time and cost required for manufacturing semiconductor crystal 2 corresponding to a height of void can be saved since the occurrence of void can be prevented.

Especially, in case of forming a device electrode on the back of substrate while using an electrically conductive material for the crystal growth substrate 1, the following effects can be further obtained.

(1) The resistivity can be lowered since, due to having no void, the thickness of semiconductor crystal 2 can be reduced and the contact area between substrate and semiconductor crystal 2 can be increased. Thereby, the drive voltage and power can be lowered.

(2) Due to having no void, the current density distribution can be nearly equal or can be made easily to be nearly equal. Thereby, the drive voltage and the amount of heat generated can be lowered, and the operation can be stabilized.

(3) Since the current density distribution can be nearly equal, uneven emission in light emitting layer can be prevented or suppressed.

(4) Since the thickness of semiconductor crystal 2 can be reduced due to having no void, the light transmission loss in LED can be reduced due to shortened light path. Thereby, the external quantum efficiency can be enhanced.

The above effects (1) and (2) can be also enjoyed in a semiconductor device other than semiconductor light emitting element.

Further, by providing the ELO mask 3 with a dome-shaped cross section as shown in FIGS. 2A and 2B and making the mask material transparent, the ELO mask 3 can function as a lens. In this case, if the refractive index of ELO mask 3 is suitably set by selecting a mask material, the ELO mask 3 can function as a convex lens to converge light. Thus, the crystal growth substrate 1 can have a light convergence function. By such a light convergence function, the problem of light diffusion described earlier can be also effectively solved.

[2] The second means of the invention is that, in the first means, at least part of the inclined plane is curved.

For example, by curving at least part of the inclined plane as shown in FIGS. 2A and 2B, the following effects can be obtained.

(1) The convex lens abovementioned can be formed to have a desired shape. Thereby, the light convergence function can be adjusted suitably.

(2) On the curved area of ELO mask 3, it is difficult to form semiconductor crystal 2 with a strong adhesion. Thus, due to the weakened adhesion, the internal stress can be reduced that may be generated in the substrate or semiconductor layer.

[3] The third means of the invention is that, in the second means, the shape of ELO mask in cross section vertical to the crystal growth surface is formed nearly semicircular, nearly semi-elliptic or partially either of these shapes.

By thus forming the cross-sectional shape of ELO mask, the cross-sectional shape of the above convex lens can be suitably adjusted according to a desired convergence function.

Figure 4A:
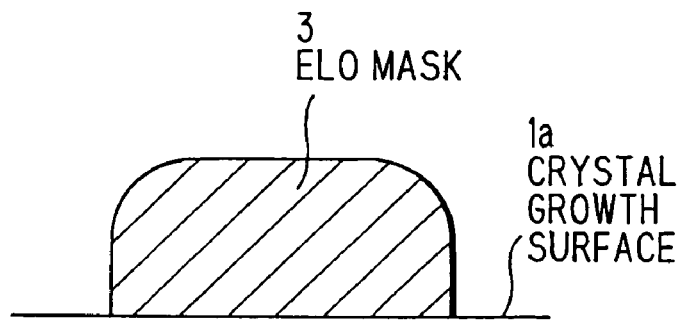
FIGS. 4A to 4C are schematic cross sectional views showing the modified shapes of ELO mask 3 in a preferred embodiment of the invention.
Figure 4B:
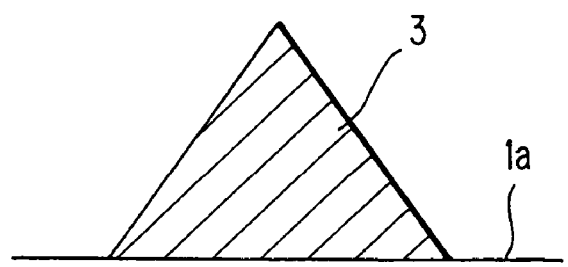
Figure 4C:
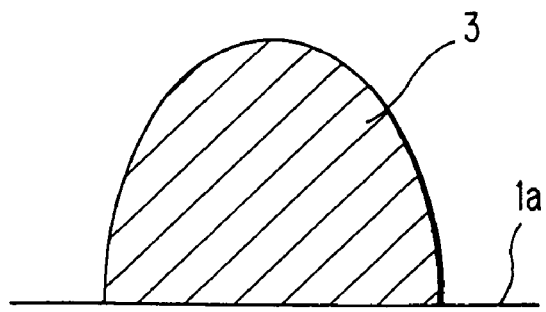

For example, the cross-sectional shape of ELO mask can be as shown in FIG. 2A and FIG. 4C. The cross-sectional shape of ELO mask in FIG. 2A resembles such a shape that a semi-ellipse is cut off its portion along the major axis of ellipse. The cross-sectional shape of ELO mask in FIG. 4C resembles such a shape that a semi-ellipse is cut off its portion along the minor axis of ellipse.

[4] The fourth means of the invention is that, in the first or second means, the shape of ELO mask in cross section vertical to the crystal growth surface is formed nearly isosceles triangular or nearly isosceles trapezoidal with flat top.

For example, the cross-sectional shape of ELO mask can be as shown in FIG. 4B and FIG. 2B. The cross-sectional shape. However, the cross-sectional shape of ELO mask 3 in FIG. 2B is formed such a nearly isosceles trapezoid (pseudo-isosceles trapezoid) that its top two corners are cut off. Such a cut-off shape is effective for providing a good convergence function. The cross-sectional shape of ELO mask 3 in FIG. 4A is also formed in like manner for the same purpose.

Further, by curving the cut-off portion, the reduced internal stress as described in the second means can be simultaneously enjoyed.

[5] The fifth means of the invention is that, in any one of the first to fourth means, the shape of ELO mask on the crystal growth surface is formed like a spot or a nearly stripe.

Herein, "spot" means nearly polygon such as regular triangle, regular hexagon, regular circle, square etc.

With such a shape, the abovementioned facet-controlled ELO can be performed simultaneously. Thereby, the number of dislocations can be also reduced in semiconductor crystal with no void or void reduced. Thus, in this composition, excellent semiconductor crystal can be grown on the crystal growth substrate. Hence, a semiconductor light emitting element with high external quantum efficiency and internal quantum efficiency can be obtained by the crystal growth process simpler than the conventional process.

The reason why the number of dislocations is reduced is that the growth direction of dislocation is changed by the inclined facet (inclined crystal growth surface). The principle relating to this function is described in prior art 3, Japanese patent application laid-open No. 11-130597 (prior art 9) etc. Especially, descriptions about the optimum stripe setting direction concerning the crystal growth surface of crystal growth substrate to be used are very helpful.

If the shape of ELO mask on the crystal growth surface is formed like a spot, the convergence function of convex lens described above can be secured easily. Especially, regular hexagon or triangle is more preferable since it can coincide with the crystal structure of semiconductor crystal. On the other hand, circle or square offers a merit that it can be easily made in view of the current processing technology level.

[6] The sixth means of the invention is that, in any one of first to fifth means, the crystal growth substrate is of sapphire.

Sapphire satisfies various requirements such as lattice constant, transparency, refractive index, price etc. and is therefore very valuable in industrial aspect. The other available material for crystal growth substrate is silicon, silicon carbide, GaN, AlInGaN, AlN, InGaN etc.

[7] The seventh means of the invention is that, in any one of first to sixth means, $Al_xGa_{1-x}N$ ($0 \leq x \leq 1$) is grown from a portion not being masked on the crystal growth surface of crystal growth substrate.

For example, GaN is very valuable, in industrial aspect, as a most basic semiconductor in making a general semiconductor device other than light emitting element. In making sequentially an essential device structure of semiconductor light emitting element, n-type GaN layer (e.g., high concentration n+ layer=n—contact layer) is needed at the beginning. Thus, it is preferable that GaN layer is directly formed on the crystal growth substrate.

However, such a semiconductor crystal ($Al_xGa_{1-x}N$) is not always needed to be formed directly on the crystal growth substrate, and it may be formed as a multilayer structure. For example, GaN layer may be formed on a buffer layer, such as low-temperature growth AlN layer and AlGaN layer, that is previously formed on the crystal growth surface of crystal growth substrate.

[8] The eighth means of the invention is that, when any one of the first to seventh means is applied to a flip-chip type LED, the refractive index of ELO mask is set to be greater than that of the crystal growth substrate and smaller than that of semiconductor crystal.

In flip-flop type LED, where light is taken out from the back side of crystal growth substrate, differences of refractive index at each interface can be effectively controlled.

In order to obtain high external quantum efficiency, the following relationship is most advantageous.

(refractive index of semiconductor crystal)>(refractive index of ELO mask)>(refractive index of crystal growth substrate).

For example, when sapphire is selected as a crystal growth substrate and GaN layer is grown thereon, the refractive index of ELO mask material is to be about 1.78 to 2.2 since the refractive index of GaN layer is about 2.2 to 2.4 and the refractive index of sapphire is about 1.78. A mask material to meet this requirement may be, e.g., $HfO_2$ (n=2.1), $ZrO_2$ (n=2.05) and $Y_2O_3$ (n=1.87).

[9] The ninth means of the invention is a method of making a semiconductor light emitting element that is made by using the lateral growth function of semiconductor crystal while providing an ELO mask on a crystal growth surface of a crystal growth substrate, wherein at least part of a sidewall of the ELO mask is provided with an inclined plane that is inclined to the crystal growth surface such that the semiconductor crystal to be formed on the ELO mask substantially has no void.

The above semiconductor crystal can be of III-nitride system compound semiconductors. The III-group nitride system compound semiconductors include a two to four elements III-nitride system compound semiconductor represented by a general formula: $Al_{1-x-y}Ga_yIn_xN$; $0 \leq x \leq 1$, $0 \leq y \leq 1$, $0 \leq 1-x-y \leq 1$ and may be doped with p-type or n-type impurity.

In the above III-group nitride system compound semiconductors, at least part of the III-group element (Al, Ga, In) may be replaced by boron (B), thallium (Tl) etc. or at least part of nitrogen (N) may be replaced by phosphorus (P), arsenic (As), antimony (Sb), bismuth (Bi) etc.

The p-type impurity includes magnesium (Mg), calcium (Ca) etc. The n-type impurity includes silicon (Si), sulfur (S), selenium (Se), tellurium (Te), germanium (Ge) etc. Two or more elements of the impurities maybe simultaneously added, and both types (p-type and n-type) of the impurities may be simultaneously added.

The ELO mask is a film or layer for crystal growth restriction to be formed on the crystal growth surface that allows the crystal growth of abovementioned semiconductor. It is provided expecting that the semiconductor crystal begins growing at a region (window section) in the crystal growth surface with no ELO mask formed and is then formed up to on the film or layer by its lateral growth function. The ELO mask may be preferably of amorphous material, but may be of a known or arbitrary material. For example, it may be of $SiO_2$, $ZrO_2$, W, $HfO_2$, $Y_2O_3$ etc.

The ELO mask is not necessarily needed to be directly formed on the crystal growth surface of crystal growth substrate. For example, the ELO mask may be formed on a known semiconductor layer such as a buffer layer previously formed on the crystal growth surface. Such a semiconductor layer previously formed on the crystal growth surface may have a multilayer structure.

However, in view of light extraction efficiency, it is desirable that the emission efficiency is to be optimized considering the magnitude relation of refractive index or the stack order in the composition of crystal growth substrate, underlying semiconductor crystal such as buffer layer, ELO mask, and semiconductor crystal layer to be grown on the ELO mask.

In the above method, some requirements in the conventional process that the AlGaN layer is to be formed as an underlying layer and that the semiconductor film with steps is to be formed can bee solved. Thus, in the above method, since the thickness of semiconductor crystal to be grown until when having a continuous flat plane of crystal growth surface to cover ELO mask can be reduced, the crystal growth process can be simplified and shortened while offering a good semiconductor crystal with no void.

The other effects of the ninth means are similar to that of the first means abovementioned. Especially, the function or effect not directly concerning the convergence function or void diffusion is effective for semiconductor crystal used to make a general semiconductor device other than a semiconductor light emitting element or light receiving element.

For example, in case of forming a device electrode on the back of substrate while using an electrically conductive material for the crystal growth substrate, the following effects can be obtained due to having no void on the ELO mask.

(1) The resistivity can be lowered since, due to having no void, the thickness of semiconductor crystal can be reduced and the contact area between substrate and semiconductor crystal can be increased. Thereby, the drive voltage and power can be lowered. Also, the increased contact area between substrate and semiconductor crystal allows an increase in contact strength therebetween.

(2) Due to having no void, the current density distribution can be ideally formed. Thereby, in making a general semiconductor device other than a semiconductor light emitting element, the drive voltage and the amount of heat generated can be lowered, and the operation can be stabilized.

[10] The tenth means of the invention is that, in the ninth means, at least part of the inclined plane is curved.

[11] The eleventh means of the invention is that, in the tenth means, the shape of ELO mask in cross section vertical to the crystal growth surface is formed nearly semicircular, nearly semi-elliptic or partially either of these shapes.

[12] The twelfth means of the invention is that, in the ninth or tenth means, the shape of ELO mask in cross section vertical to the crystal growth surface is formed nearly isosceles triangular or nearly isosceles trapezoidal with flat top.

[13] The thirteenth means of the invention is that, in any one of the ninth to twelfth means, the shape of ELO mask on the crystal growth surface is formed like a spot or a nearly stripe.

[14] The fourteenth means of the invention is that, in any one of ninth to thirteenth means, the crystal growth substrate is of sapphire.

[15] The fifteenth means of the invention is that, in any one of ninth to fourteenth means, $Al_xGa_{1-x}N$ ($0 \leq x \leq 1$) is grown from a portion not being masked on the crystal growth surface of crystal growth substrate.

The function and effect of the tenth to fifteenth means are similar to those of the second to seventh means. Especially, the function or effect not directly concerning the convergence function or void diffusion is effective for semiconductor crystal used to make a general semiconductor device other than a semiconductor light emitting element or light receiving element.

[16] The sixteenth means of the invention is that, in the fifteenth means, the amount of trimethylgallium ($Ga(CH_3)_3$) to be supplied per unit time in growing the semiconductor crystal is preferably 100 μmol/min. or more and 800 μmmol/min. or less.

In growing semiconductor crystal from a concave portion (window section) that is not covered with the ELO mask in the crystal growth surface, the above supply amount is suitable. With such a supply amount, the semiconductor crystal can be evenly grown sequentially from the concave portion. In other words, with such a supply amount, the growth of semiconductor crystal from top face or side face of a convex portion being covered with the ELO mask can be prevented.

Further, the amount of trimethylgallium ($Ga(CH_3)_3$) to be supplied per unit time in growing the semiconductor crystal is more preferably 100 μmol/min. or more and 600 μmol/min. or less. If the supply amount is too large, the growth of semiconductor crystal on the upper side (a position distant from the substrate) or in the vertical direction becomes significantly faster than that on the lower side (a position close to the substrate) or in the lateral direction. On the other hand, if the supply amount is too small, the crystal growth process requires much time and its efficiency lowers.

EXAMPLES

In examples below, (1) ELO mask process and (2) crystal growth process that can be directly applied to a method of making a semiconductor light emitting element will be described.

(1) ELO Mask Process

FIGS. 5A to 5F are schematic cross sectional views showing a process of making an ELO mask 3 in the preferred embodiment of the invention.

Figure 5A:
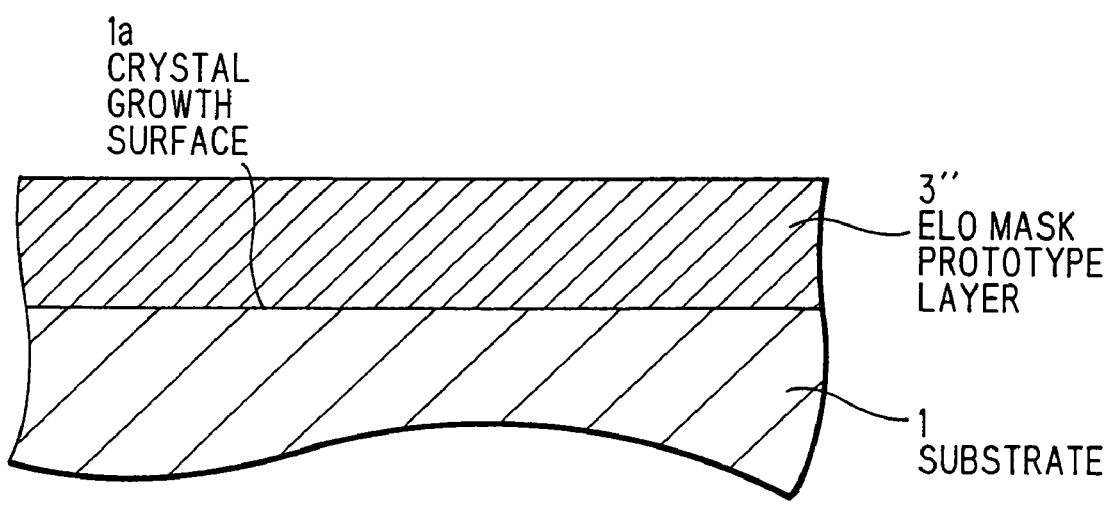
FIGS. 5A to 5F are schematic cross sectional views showing a process of making an ELO mask 3 in a preferred embodiment of the invention.
Figure 5B:
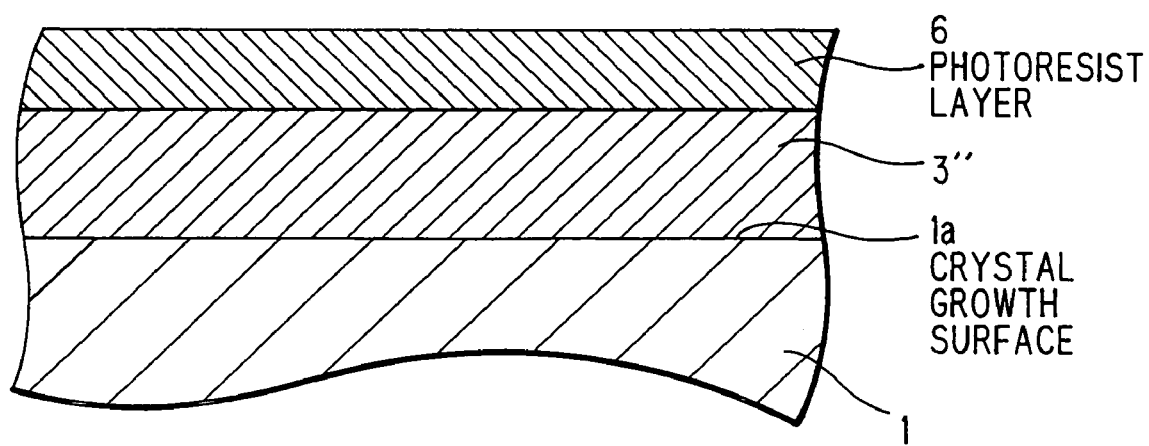

(A) Plasma CVD Step [FIG. 5A]

First, a crystal growth substrate 1 of sapphire is provided. Asapphirea-faceisusedasa crystal growth surface 1a. Then, ELO mask prototype layer 3" of $SiO_2$ is grown about 1.0 μm on the crystal growth surface 1a (sapphire a-face) by using a microwave plasma CVD device.

The operation conditions of plasma CVD device as well as the flow rate of source gases are as follows:
Pressure: 70 Pa
Substrate Temperature: 300° C.
Microwave Output: 50 W
$SiH_4$ (8%): 25 sccm
$N_2O$: 150 sccm
$N_2$: 500 sccm (B) Photoresist Coating Step [FIG. 5B]

Then, a photoresist layer 6 is coated about 1.6 μm by using a spin coater. Pre-baking time is 60 sec. and the treatment temperature is 100° C.

Figure 5C:
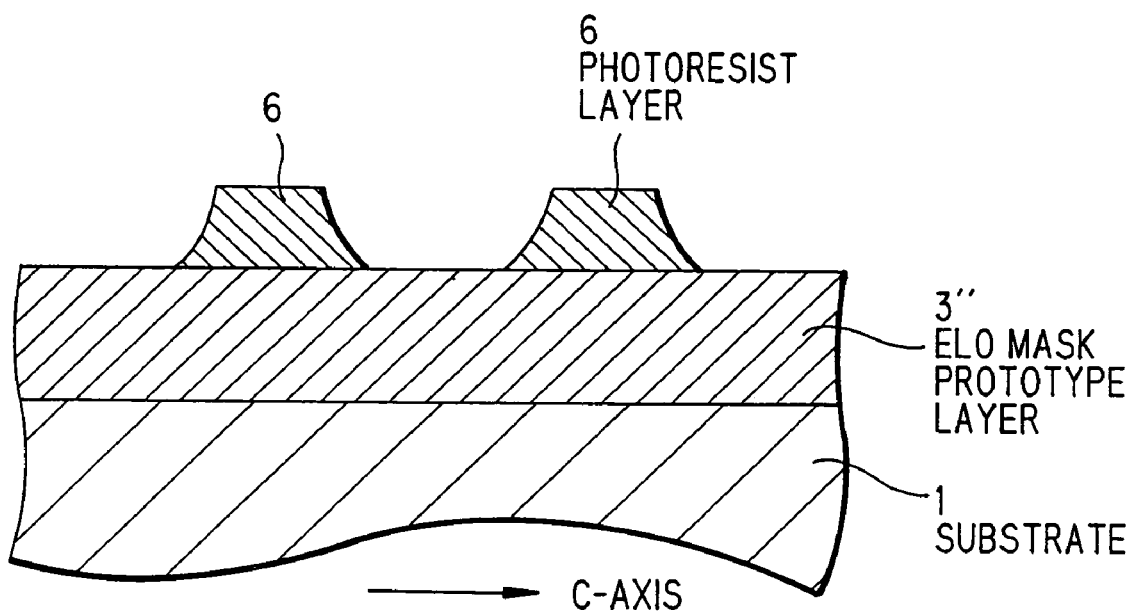

(C) Exposure and Development Steps [FIG. 5C]

Then, the photoresist layer 6 is exposed at a lighting intensity of 400 mJ/cm$^2$. However, with regard to a region corresponding to a side-wall inclined plane of ELO mask in photoresist layer 6, the amount of exposure is set to continuously and gradually increase according as it comes close to a window section. By setting thus, as shown in FIG. 5C, the photoresist layer 6 can have an inclined plane on its side wall.

ELO mask has a stripe mask pattern that extends vertically to c-axis on the sapphire a-face. A stripe width W and an interval D (=a window width) between stripes each are about 4 μm.

Subsequently, development time is 60 sec. and post-baking is conducted at 120° C. for 120 sec. By conducting the above steps, a structure with the cross section as shown in FIG. 5C can be obtained.

Figure 5D:
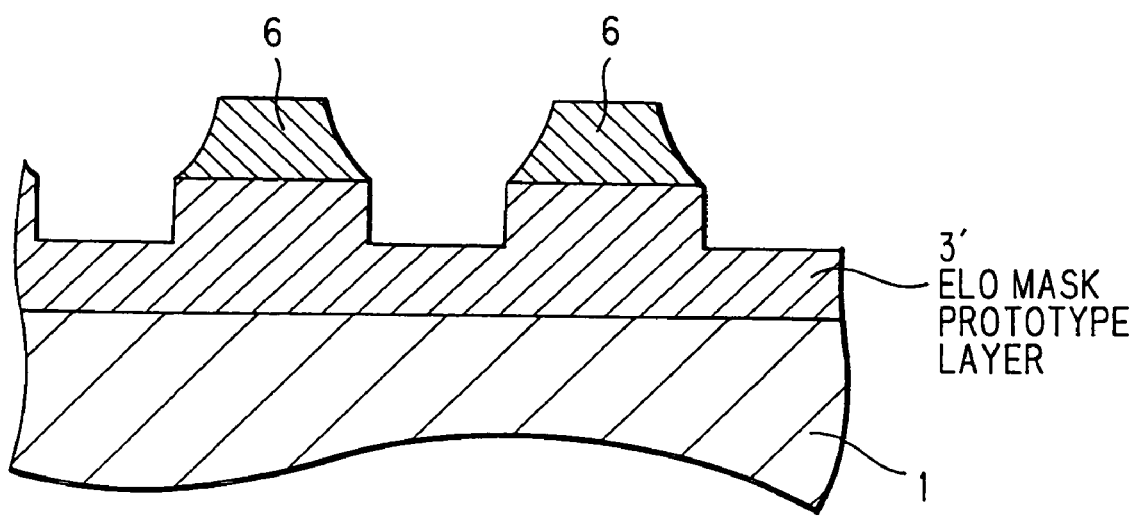

(D) Half Wet Etching Step [FIG. 5D]

Then, in order to form ELO mask prototype layer 3' as shown in FIG. 5D, ELO mask prototype layer 3" of $SiO_2$ in FIG. 5C is half wet etched. In the wet etching, the crystal growth substrate 1 with ELO mask prototype layer 3" is soaked in BHF solution ($NH_4F/HF/H_2O$) at room temperature for 2 min. After that, it is washed by pure water for 5 min. By conducting the above step, a structure with the cross section as shown in FIG. 5D can be obtained.

Figure 5E:
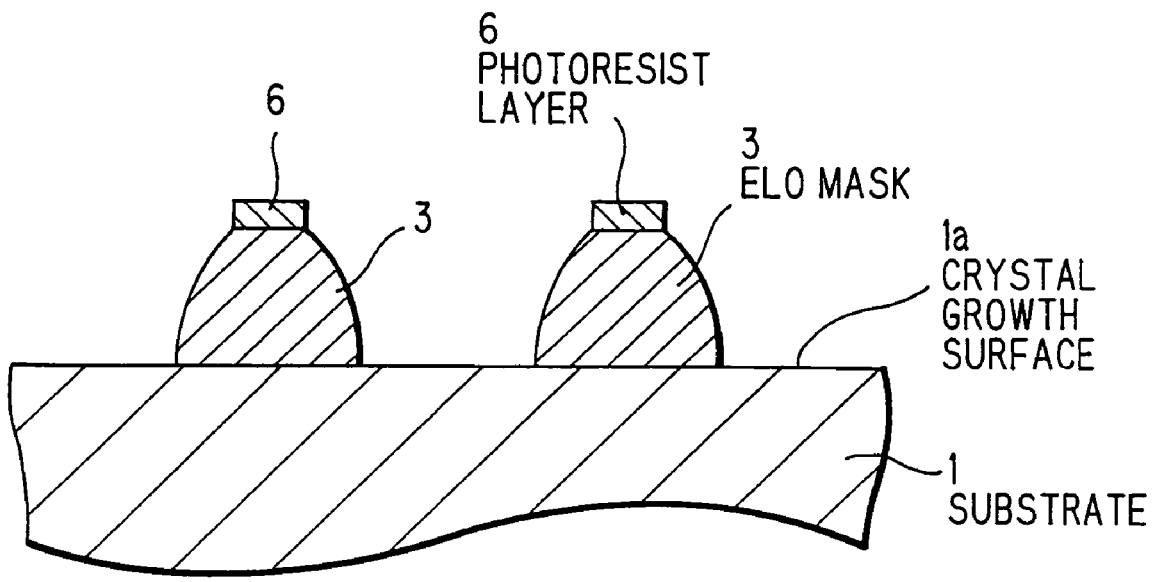

(E) Dry Etching Step [FIG. 5E]

Then, in order to form ELO mask 3 as shown in FIG. 5E, dry etching is conducted using an ICP etching device. In the dry etching, both the photoresist layer 6 and ELO mask prototype layer 3' in FIG. 5D are partially etched. In this regard, it is important to select a material of the photoresist layer 6 and ELO mask prototype layer 3' and to design a shape thereof. For example, if the hardness or fragility of etched layer is suitably adjusted, the etching speed of etched layer can be suitably controlled.

Thus, with such a suitable or optimum adjustment, for example, a desired cross section as shown in FIG. 5E can be obtained since the photoresist layer 6 in FIG. 5D has the inclined plane. Further, by controlling the shape of photoresist and the conditions of dry etching, the top flat portion of ELO mask 3 may be removed.

Meanwhile, the technique that an inclined plane of lower layer is formed to have a desired shape based on a shape of inclined plane of upper layer is known (e.g., Japanese patent application laid-open No. 2001-160657 (prior art 10) (FIG. 2))

Figure 5F:
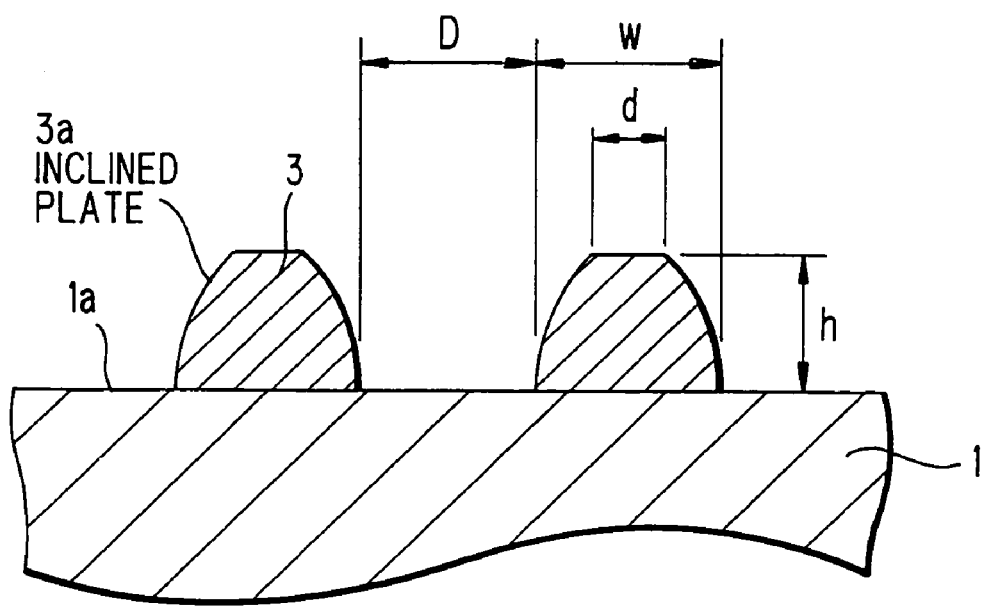

(F) Photoresist Removing Step [FIG. 5F]

Finally, the remaining photoresist on the top fat portion of ELO mask 3 that has a desired cross section as shown in FIG. 5F is removed using a solution. Then, it is washed and dried.

By conducting the above step, an ELO mask structure with the desired cross section as shown in FIG. 5F can be obtained.

The dimensions of ELO mask 3 are as follows:

H (height of ELO mask 3)=1.0 µm

W (width of ELO mask 3)=4 µm d (width of top flat portion of ELO mask 3)=1 µm

D (window width)=4 µm (2) Crystal Growth Process

FIGS. 6A to 6D are schematic cross sectional views showing a process of making a semiconductor crystal 2 in the preferred embodiment of the invention.

The crystal growth process is conducted by MOVPE (metal-organic vapor phase epitaxy). Source gases used are ammonia gas ($NH_3$), carrier gases ($H_2$, $N_2$), trimethylgallium gas (Ga $(CH_3)_3$, herein referred to as TMG) and trimethylaluminum gas ($Al(CH_3)_3$, herein referred to as TMA) etc.

First, the crystal growth substrate 1 with ELO mask 3 as shown in FIG. 5F is placed on a susceptor disposed in a reaction chamber, and it is baked at 1100° C. while flowing $H_2$ gas at room temperature into the reaction chamber.

Figure 6A:
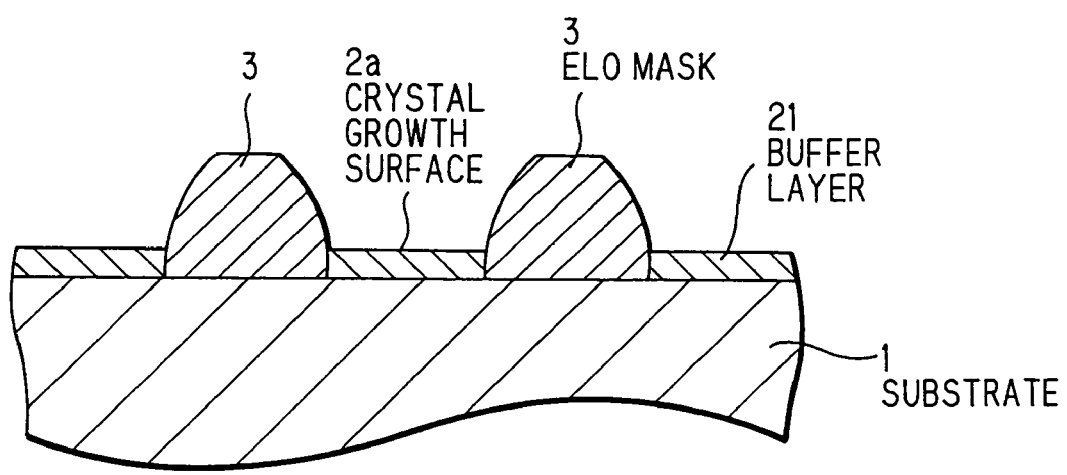

(A) Buffer Layer Formation Step [FIG. 6A]

The crystal growth substrate 1 in FIG. 5F is cooled down to about 400° C. On the substrate 1, a buffer layer 21 (low-temperature growth AlN layer) of AlN is formed about 0.3 µm by MOVPE. The flow rates of source gases are $H_2$: 20 litter/min., $NH_3$: 10 litter/min., and TMA: 1.8 mole/min. 2a indicates a crystal growth surface 2a of semiconductor crystal (buffer layer 21).

Figure 6B:
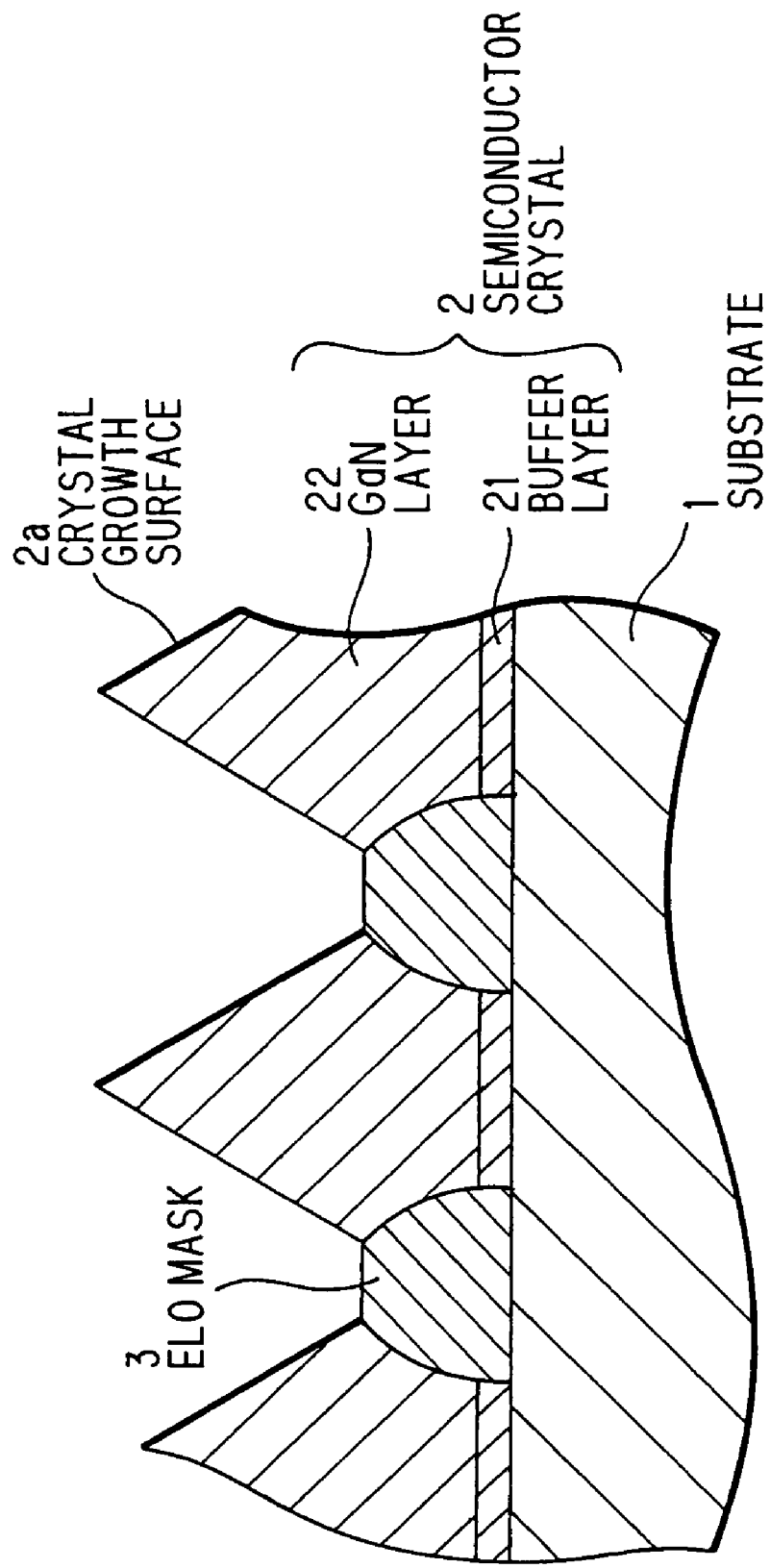
Figure 6D:
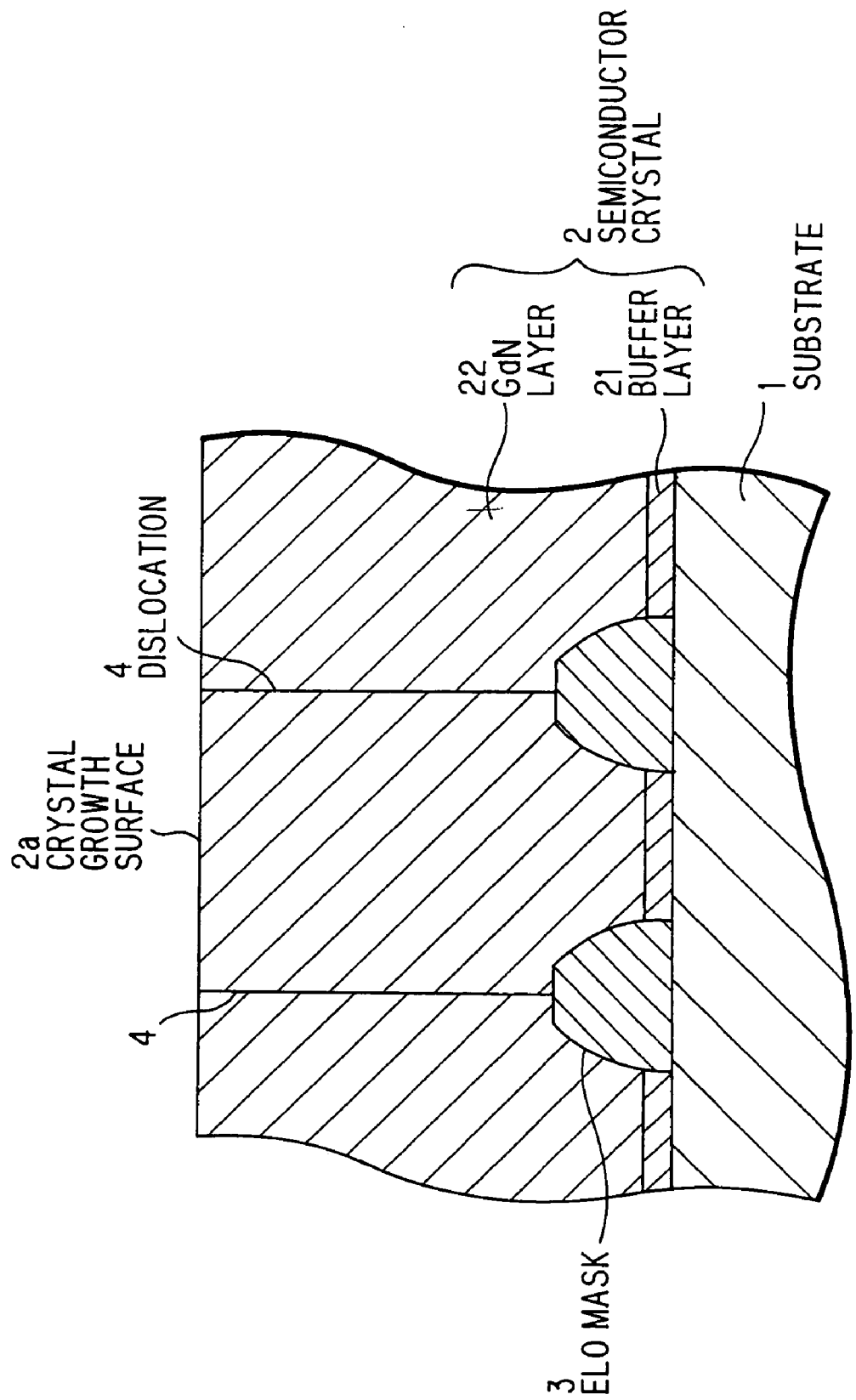

(B) GaN Layer Formation Step [FIGS. 6B to 6D]

Then, heating up to a growth temperature of 1075° C., a GaN layer 22 to compose part of the semiconductor crystal 2 is grown on the buffer layer 21 by MOVPE while supplying $H_2$, $NH_3$ and TMG. The flow rate of TMGgas is about 250 µmole/min. With such a setting, as described earlier, the semiconductor crystal 2 can be grown sequentially and uniformly from the bottom of window section. Further, with such a setting, it is possible to make the growth of semiconductor crystal difficult to start from the top face or side of protruded portion.

In FIG. 6B, 2a indicates a crystal growth surface of semiconductor crystal 2 (GaN layer 22). As shown in FIG. 6B, the GaN layer 22 is grown like an inclined facet.

When the crystal of GaN layer 22 is continuously grown under the same conditions, a hollow region between the inclined facets is filled with as shown in FIG. 6C. Finally, as shown in FIG. 6D, a continuous crystal growth surface 2a is formed nearly flat. In FIGS. 6C and 6D, 4 indicates a dislocation that is defined as a contact face where GaN layers 22 being laterally grown above the ELO mask 3 contact each other.

By conducting the above process, as shown in FIG. 6D, the semiconductor crystal 2 composed of buffer layer 21 and GaN layer 22 and with no void can be obtained.

The plain-viewed pattern of ELO mask 3 is not limited to a stripe and may be an arbitrary pattern, to which the above crystal growth process can be applied.

Although in this example the low-temperature growth AlN buffer layer is used as a buffer layer, the material of buffer layer is not limited to AlN. A known effective or useful buffer layer such as AlGaN and GaN other than AlN may be formed on the crystal growth substrate 1.

Depending on various conditions such as a material of ELO mask 3 or buffer layer 21 or a flow rate of source gas, the buffer layer 21 may be thinly formed on the ELO mask 3. In such a case, only the buffer layer 21 formed on the ELO mask 3 may be removed by selective etching or another ELO mask may be formed again on only the buffer layer 21 formed on the ELO mask 3. By such a step, a given semiconductor crystal maybe grown into a desired shape such as an inclined facet.

(3) Modifications of the Examples

Although in the above example the half wet etching is conducted using BHF solution, this process is not always needed. If the conditions of photolithography or dry etching are optimized to obtain a desired cross section of ELO mask 3, the above-mentioned half wet etching using BHF solution can be eliminated.

In the above exposure step, in order to form the photoresist layer 6 with the cross section as shown in FIG. 5C, with regard to a region corresponding to a side-wall inclined plane of ELO mask in photoresist layer 6, the amount of exposure is set to continuously and gradually increase according as it comes close to a window section. However, even when the side wall of ELO mask 3 stands nearly vertically, the photoresist layer 6 may be formed like a semisphere by its own surface tension when the photoresist layer 6 is subjected to suitable heating to be suitably softened or liquidized.

Such a shape can be adjusted by selecting a suitable temperature in softening or liquidizing the material of photoresist layer 6. Also in this process, the above-mentioned half wet etching using BHF solution can be eliminated by optimizing the conditions of photolithography or dry etching.

Such a process is very effective in fabricating ELO mask 3 with a desired convex lens shape in cross-section. A substrate or semiconductor crystal with such a lens is very useful in fabricating, for example, a flip-chip type LED.

Preferred Example

Figure 7A:
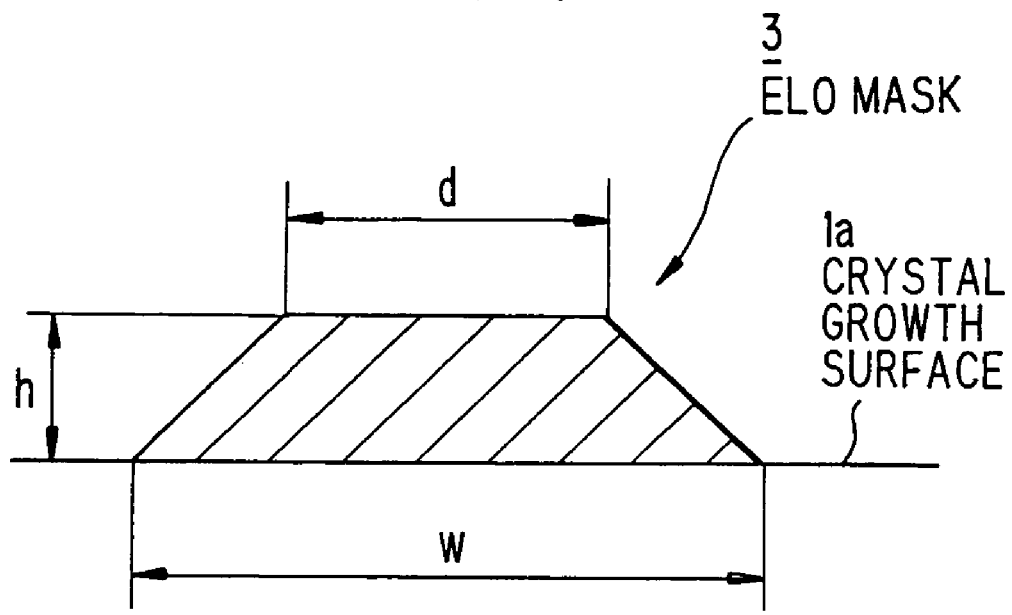
FIGS. 7A and 7B are cross sectional views showing an ELO mask 3 in a preferred example of the invention.
Figure 7B:
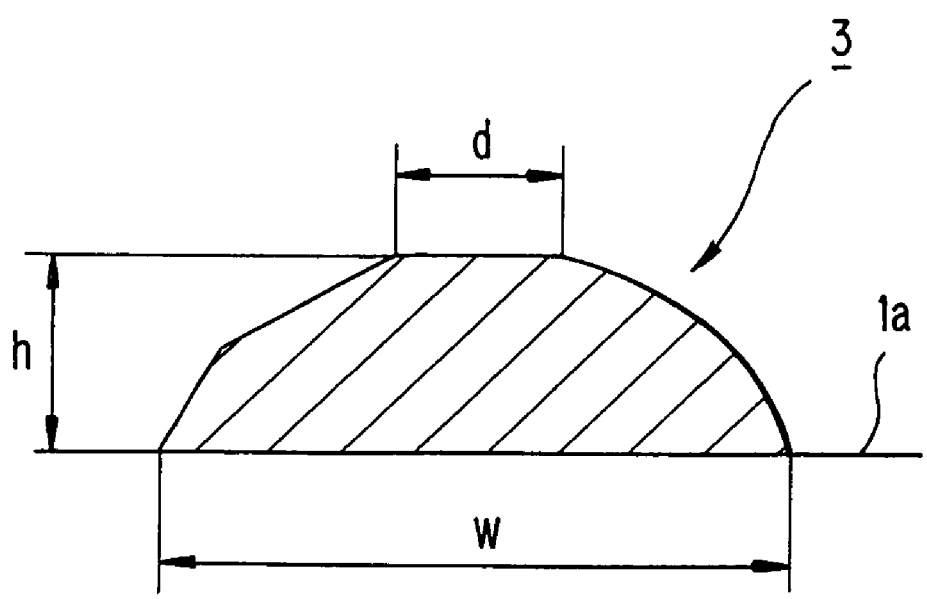

FIGS. 7A and 7B are cross sectional views showing an ELO mask 3 in the preferred example of the invention.

Like the above examples, 1a, h, w and d indicate a crystal growth surface of substrate, a height of ELO mask 3, a width (or diameter) of ELO mask 3 and a width (or diameter) of top flat portion of ELO mask 3, respectively.

These dimensions are preferably to satisfy the following relational expressions so as to reduce the number of void:

$$d < w/5 \quad \text{(i)}$$

$$d < 5h \quad \text{(ii)}$$

$$w < 5 \; \mu m \quad \text{(iii)}$$

$$h < 1.5 \; \mu m \quad \text{(iv)}$$

By setting thus, the occurrence of void can be effectively suppressed and the number of dislocation can be effectively reduced.

In manufacturing a wire bonding type LED, a useful material for ELO mask 3 is tungsten (W) which has excellent reflection function or $SiO_2$ which has a small refractive index (n=1.46). By using such a material, the external quantum efficiency can be enhanced. In such a composition, light to be reflected upward (on the side of semiconductor crystal 2) by the ELO mask 3 diffuses in a relatively wide range. Thus, it can be applied preferably to, e.g., an indoor lighting LED.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor light emitting element, comprising:
   a crystal growth substrate;
   an epitaxial lateral overgrowth (ELO) mask formed on said substrate; and
   a semiconductor crystal formed on said substrate and said ELO mask,
   wherein at least part of a sidewall of the ELO mask comprises an inclined plane that is inclined to the crystal growth surface such that the semiconductor crystal to be formed on the ELO mask substantially has no void.

2. The semiconductor light emitting element according to claim 1, wherein at least part of the inclined plane is curved.

3. The semiconductor light emitting element according to claim 2, wherein the ELO mask comprises a cross section in a direction perpendicular to the crystal growth surface which is one of approximately semi-circular, approximately elliptical, partly semi-circular, and elliptical.

4. The semiconductor light emitting element according to claim 1, wherein the ELO mask comprises a cross section in a direction perpendicular to the crystal growth surface which is one of approximately isosceles triangular and approximately isosceles trapezoidal with a flat top.

5. The semiconductor light emitting element according to claim 1, wherein the ELO mask comprises one of a spot shape and an approximately stripe shape.

6. The semiconductor light emitting element according to claim 1, wherein the crystal growth substrate comprises sapphire.

7. The semiconductor light emitting element according to claim 1, wherein the semiconductor crystal comprises $Al_xGa_{1-x}N (0 \leq x \leq 1)$.

8. The semiconductor light emitting element according to claim 1, wherein the semiconductor light emitting element comprises a flip-chip type light-emitting diode (LED), and
   wherein the refractive index of the ELO mask is greater than the refractive index of the crystal growth substrate and smaller than the refractive index of the semiconductor crystal.

9. The semiconductor light emitting element according to claim 1, wherein said ELO mask comprises at least one of a dome-shaped mask, and a convex lens-shaped mask which converges light.

10. The semiconductor light emitting element according to claim 1, wherein said ELO mask comprises a transparent mask.

11. The semiconductor light emitting element according to claim 1, wherein said ELO mask comprises one of $SiO_2$, $ZrO_2$, W, $HfO_2$, and $Y_2O_3$.

12. The semiconductor light emitting element according to claim 1, wherein said ELO mask comprises an amorphous material.

13. The semiconductor light emitting element according to claim 1, wherein said crystal growth substrate comprises a sapphire substrate.

14. The semiconductor light emitting element according to claim 1, wherein said crystal growth substrate comprises one of silicon, silicon carbide, GaN, AlInGaN, AlN and InGaN.

15. The semiconductor light emitting element according to claim 1, wherein said semiconductor crystal comprises a GaN layer which is formed directly on said substrate.

16. The semiconductor light emitting element according to claim 1, wherein substantially no voids are formed between said mask layer and said semiconductor crystal.

17. The semiconductor light emitting element according to claim 1, wherein inclined plane forms a three-dimensional angle with a crystal growth surface of said substrate.

18. The semiconductor light emitting element according to claim 5, wherein said spot shape comprises a polygon shape including one of a triangle shaper hexagon shape, circle shape and square shape.

19. A semiconductor light emitting element, comprising:
    a crystal growth substrate;
    an epitaxial lateral overgrowth (ELO) mask formed on said substrate and having a sidewall with an inclined plane; and
    a semiconductor crystal layer formed on said substrate and said ELO mask,
    wherein said inclined plane inhibits formation of a void between said semiconductor crystal layer and said mask layer during formation of said semiconductor crystal layer.

20. A semiconductor light emitting element, comprising:
    a sapphire crystal growth substrate;
    an epitaxial lateral overgrowth (ELO) mask formed on said substrate, said mask comprising an amorphous material and having a sidewall with a curved inclined plane; and a semiconductor crystal layer which comprises $Al_xGa_{1-x}N (0 \leq x \leq 1)$ and is formed on said substrate and said ELO mask, wherein said curved inclined plane inhibits formation of a void between said semiconductor crystal layer and said mask layer during formation of said semiconductor crystal layer.

* * * * *

UNITED STATES PATENT AND TRADEMARK OFFICE
CERTIFICATE OF CORRECTION

PATENT NO. : 7,087,930 B2　　　　　　　　　　　　　　　　　　　　Page 1 of 1
APPLICATION NO. : 10/808422
DATED : August 8, 2006
INVENTOR(S) : Masanobu Senda et al.

It is certified that error appears in the above-identified patent and that said Letters Patent is hereby corrected as shown below:

On Title Page, replace Item "(73) Assignee: Toyodaa Gosei Co., Ltd., Aichi-ken (JP)"

with    "(73) Assignee: Toyoda Gosei Co., Ltd., Aichi-ken (JP)"

Signed and Sealed this

Fifth Day of December, 2006

JON W. DUDAS
*Director of the United States Patent and Trademark Office*